United States Patent
Miyashita et al.

(10) Patent No.: US 9,740,648 B2
(45) Date of Patent: Aug. 22, 2017

(54) SUBSTRATE TREATMENT APPARATUS THAT CONTROLS RESPECTIVE UNITS BY MASTER-SLAVE METHOD

(71) Applicant: SCREEN Holdings Co., Ltd., Kyoto (JP)

(72) Inventors: Takuya Miyashita, Kyoto (JP); Satoshi Segawa, Kyoto (JP); Naoyuki Osada, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 286 days.

(21) Appl. No.: 14/595,263

(22) Filed: Jan. 13, 2015

(65) Prior Publication Data
US 2015/0220468 A1    Aug. 6, 2015

(30) Foreign Application Priority Data
Jan. 31, 2014  (JP) ................. 2014-016817

(51) Int. Cl.
*G06F 13/364* (2006.01)
*H01L 23/28* (2006.01)
*G05B 19/418* (2006.01)

(52) U.S. Cl.
CPC ....... *G06F 13/364* (2013.01); *G05B 19/4185* (2013.01); *H01L 23/28* (2013.01); *Y02P 90/18* (2015.11)

(58) Field of Classification Search
CPC ............... G06F 13/364; H01L 23/3142; H01L 23/53223; H01L 23/53238; H01L 23/53252; H01L 23/53266; H01L 23/28
(Continued)

(56) References Cited

U.S. PATENT DOCUMENTS 7,435,447 B2 * 10/2008 Parent .................... G01N 21/53
                                                    134/108
7,510,884 B2    3/2009 Okabe et al. ................... 438/11
(Continued)

FOREIGN PATENT DOCUMENTS

CN    1617299 A    5/2005
CN    1751280 A    3/2006
(Continued)

OTHER PUBLICATIONS

Korean Decision of Grant issued on Sep. 29, 2016.
(Continued)

*Primary Examiner* — Glenn A Auve
(74) *Attorney, Agent, or Firm* — Ostrolenk Faber LLP

(57) ABSTRACT

A valve control unit includes a data reading/selecting unit, which reads each of signals transmitted onto a serial bus, and selects a flow rate data signal from among the read signals. Therefore, the valve control unit can acquire the flow rate data signal from the serial bus without allowing the flow rate data signal to pass via the master IC. As a result, it is made possible to ensure real time properties of feedback control, which adjusts a needle valve based on a measurement result of a flowmeter, while reducing a load applied to a CPU that controls the master IC. Moreover, it is not necessary to provide an additional instrument for transferring analog signals between slave devices, and accordingly, a size increase and cost increase of an apparatus can be suppressed.

10 Claims, 7 Drawing Sheets

(58) Field of Classification Search
USPC .................................. 710/110; 438/106, 118
See application file for complete search history.

(56) References Cited

U.S. PATENT DOCUMENTS

| | | | |
|---|---|---|---|
| 7,676,342 B2 | 3/2010 | Vreede et al. ................ | 702/127 |
| 2005/0097730 A1 | 5/2005 | Yamamoto et al. ............ | 29/745 |
| 2006/0172442 A1* | 8/2006 | Okabe ....................... | G01F 1/68 |
| | | | 438/14 |
| 2012/0323855 A1 | 12/2012 | Koyama et al. ............. | 707/661 |
| 2013/0092258 A1 | 4/2013 | Yasuda et al. ................ | 137/487 |
| 2014/0373935 A1 | 12/2014 | Nishino et al. ............... | 137/102 |

FOREIGN PATENT DOCUMENTS

| | | |
|---|---|---|
| CN | 103035467 A | 4/2013 |
| JP | H04-313107 A | 11/1992 |
| JP | H8-110805 | 4/1996 |
| JP | H8-255735 | 10/1996 |
| JP | 2010-123709 | 6/2010 |
| JP | 2013-156801 A | 8/2013 |
| TW | 200842534 A | 11/2008 |

OTHER PUBLICATIONS

The Taiwan Office Action (Application No. 104103330) issued on Jan. 16, 2017.
Chinese Office Action dated Mar. 7, 2017 for Chinese counterpart Application No. 201510053169.8.

* cited by examiner

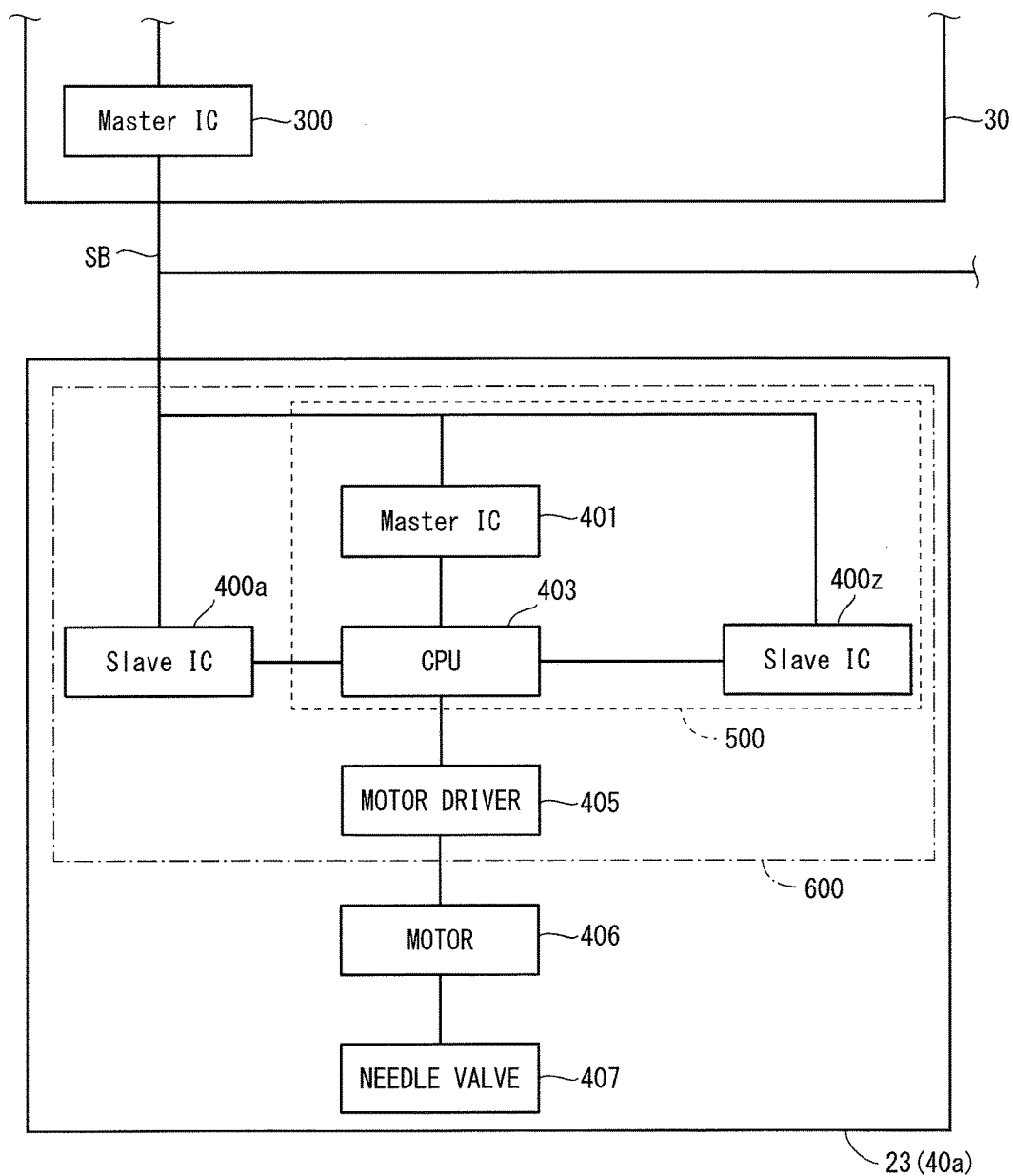
F I G. 4

F I G. 8
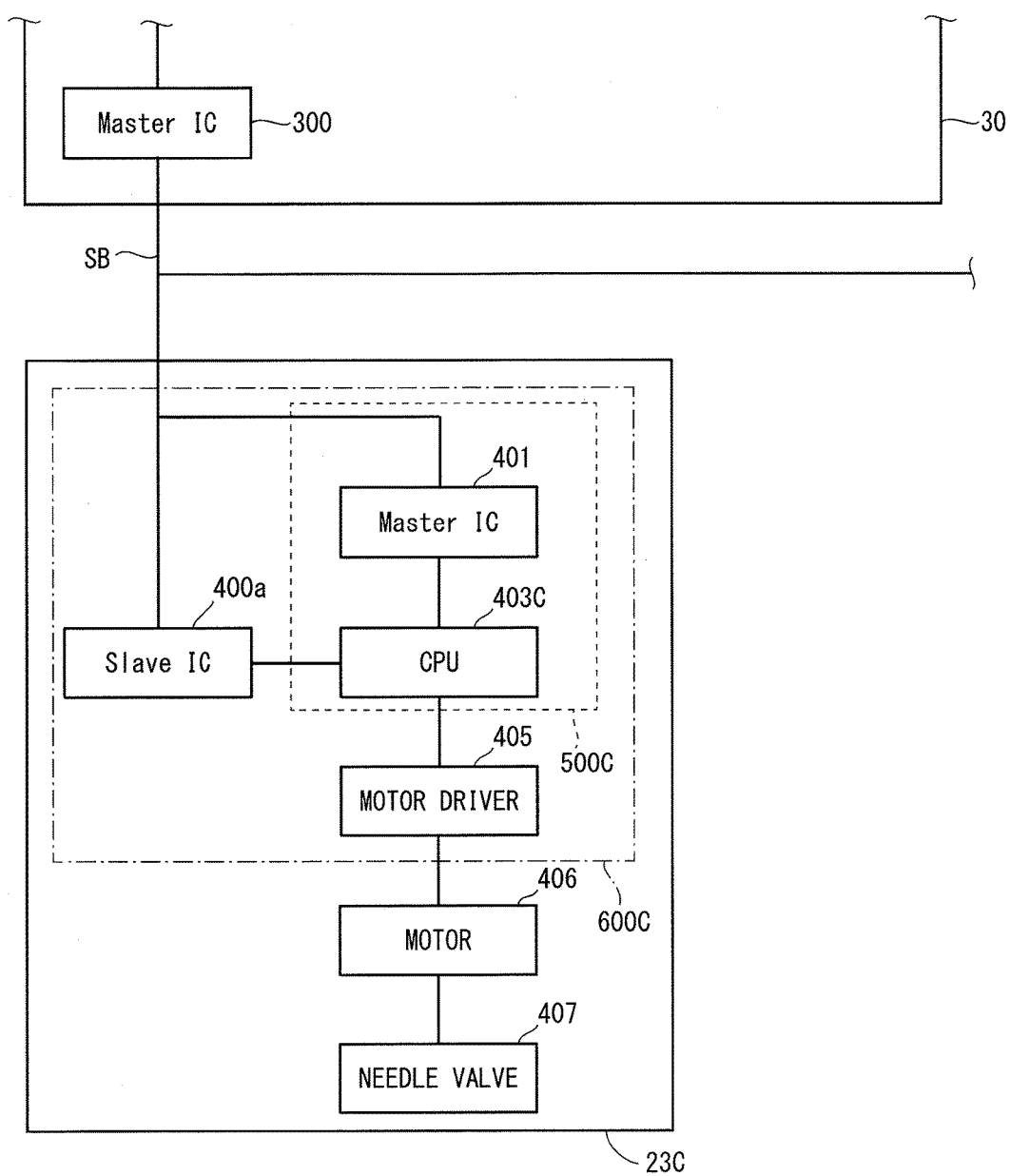

SUBSTRATE TREATMENT APPARATUS THAT CONTROLS RESPECTIVE UNITS BY MASTER-SLAVE METHOD

BACKGROUND OF THE INVENTION

Field of the Invention

The present invention relates to a substrate treatment apparatus that controls respective units by a master-slave method.

Description of the Background Art

As a substrate treatment apparatus, there is known a single wafer apparatus that treats substrates such as semiconductor wafers one by one. This type of apparatus includes: a plurality of treatment units; a conveying robot capable of conveying the substrates to the respective treatment units; and a control unit, then controls the plurality of treatment units and the conveying robot by the control unit, and thereby executes substrate treatment sequentially for a plurality of the substrates.

In this case, in general, the control unit is defined as a master device, drivers of the respective treatment units and the conveying robot are defined as a plurality of slave devices placed in a relatively lower control hierarchy than that of the master device, and the master device controls the plurality of slave devices by a master-slave method.

For example, in Japanese Patent Application Laid-Open No. 2010-123709, into treatment liquid supply pipes which supply treatment liquids to the substrates in the respective treatment units, there are interposed: valve control units (slave devices), which adjust flow rates of the treatment liquids flowing through the pipes by valves; and flowmeters (slave devices), which measure the flow rates of the treatment liquids flowing through the pipes. Then, values of the flow rates measured by the flowmeters are given to the valve control units via a control unit (master device), and feedback control, which adjusts valve openings by the valve control units based on such flow rate values, is performed.

However, in the above-described mode of performing data transfer via the control unit (master device), as the slave devices controlled by the master device have been being increased, a load applied to the master device has been increased, and it has been difficult to ensure real time properties of the above-described feedback control.

In this connection, as another mode, a mode is also conceivable, in which the flowmeters and the valve control units are connected to each other by analog signal lines, and the data transfer of the flow rate values is directly performed from the flowmeters to the valve control units. However, in this mode, though it has been made possible to ensure the real time properties of the above-described feedback control while reducing the load applied to the master device, there have occurred an error owing to digital/analog conversion and a delay of a speed of signal transmission. Moreover, a necessity to provide an additional instrument for transferring analog signals has arisen, and has brought about a size increase and cost increase of the apparatus.

These problems are not only applied to the substrate treatment apparatus that performs the above-described flow rate adjustment, and are problems common to a variety of substrate treatment apparatuses, each of which includes: a measuring slave that measures, as an index value, at least one physical quantity regarding an operation state of substrate treatment; and an adjustment unit that adjusts the above-described operation state based on a measurement result by the measuring slave.

SUMMARY OF THE INVENTION

The present invention is directed to a substrate treatment apparatus.

In an aspect of the present invention, a substrate treatment apparatus includes: (a) a first master that performs apparatus control for the substrate treatment apparatus; and (b) a plurality of lower control elements placed as relatively lower control hierarchies than the first master and communicable with the first master through a bus, wherein each of the plurality of lower control elements includes: (b-1) a measuring slave that measures, as an index value, at least one physical quantity regarding an operation state of substrate treatment, and transmits a measurement result of the physical quantity as a measured data signal, which is readable by the first master, to the bus; (b-2) a master-slave complex system provided as a control system for an adjustment unit that adjusts the operation state; wherein the master-slave complex system includes: an adjustment-instructed slave that receives an instruction signal from the first master regarding adjustment of the operation state; a data reading/selecting unit including a second master that reads each of signals, which is transmitted to the bus from each of the lower control elements, simultaneously with the first master, the data reading/selecting unit selecting the measured data signal among the signals; an arithmetic operation unit that performs an arithmetic operation based on the measured data signal and generates a control signal for the adjustment unit; and an adjustment control unit that controls the adjustment unit based on the control signal given from the arithmetic operation unit.

The substrate treatment apparatus includes: the measuring slave that transmits the measurement result as the measured data signal to the bus; and the master-slave complex system, the measuring slave and the master-slave complex system serving as the lower control elements serially communicable with the first master through the bus. The master-slave complex system includes the data reading/selecting unit, which reads each of signals transmitted onto the bus from each of the plurality of lower control elements, and selects the measured data signal from among the above-described respective read signals. Therefore, the master-slave complex system can acquire the measured data signal from the bus without allowing the measured data signal to pass via the first master. As a result, in the substrate treatment apparatus, it is made possible to ensure the real time properties of the control (feedback control), which adjusts the adjustment unit based on the measurement result of the measuring slave, while reducing the load applied to the first master. Moreover, in the substrate treatment apparatus, it is not necessary to provide an additional instrument for transferring analog signals between the lower control elements, and accordingly, a size increase and cost increase of the apparatus can be suppressed.

Preferably, the data reading/selecting unit includes: the second master; a selecting slave that is communicable with the first master through the bus and transmits a strobe signal in response to communication with the first master; and a selection unit that receives each of the signals from the second master, receives the strobe signal from the selecting slave, determines serial transmission timing of each of the signals based on the strobe signal, and selects the measured data signal from among the signals.

Preferably, in the substrate treatment apparatus, address information of a transmission source of each of the signals is included in each of the signals, and the data reading/selecting unit includes: the second master; and a selection unit that receives each of the signals from the second master and selects, as the measured data signal, a signal including address information of the measuring slave among the signals.

Preferably, the operation state is a state of a specific fluid in the substrate treatment, and the index value is a flow rate value of the fluid, and the measuring slave is a flowmeter.

Preferably, the operation state is a state of a specific fluid in the substrate treatment, and the index value is a pressure value of the fluid, and the measuring slave is a pressure gauge.

Preferably, the operation state is a state of a specific fluid in the substrate treatment, and the index value is difference between pressure values of the fluid at a plurality of spots, and the measuring slave is a differential pressure gauge.

Preferably, the adjustment unit is a valve that adjusts the flow rate value.

Preferably, the adjustment unit is a damper that adjusts the pressure value.

Preferably, the adjustment unit is a damper that adjusts the pressure value.

Preferably, each element of the master-slave complex system is packaged on a single control board.

Therefore, it is an object of the present invention to provide a substrate treatment apparatus capable of ensuring the real time properties of the feedback control by reducing the load applied to the master device while suppressing the size increase and cost increase of the apparatus.

These and other objects, features, aspects and advantages of the present invention will become more apparent from the following detailed description of the present invention when taken in conjunction with the accompanying drawings.

BRIEF DESCRIPTION OF THE DRAWING

FIG. 4 is a block diagram illustrating an electrical configuration of a slave device 40a (valve control unit 23);

FIG. 8 is a block diagram illustrating an electrical configuration of a valve control unit 23C according to a comparative example.

DESCRIPTION OF THE PREFERRED EMBODIMENTS

1. First Preferred Embodiment

<1.1 Schematic Configuration of Substrate Treatment Apparatus 1>

Figure 1:
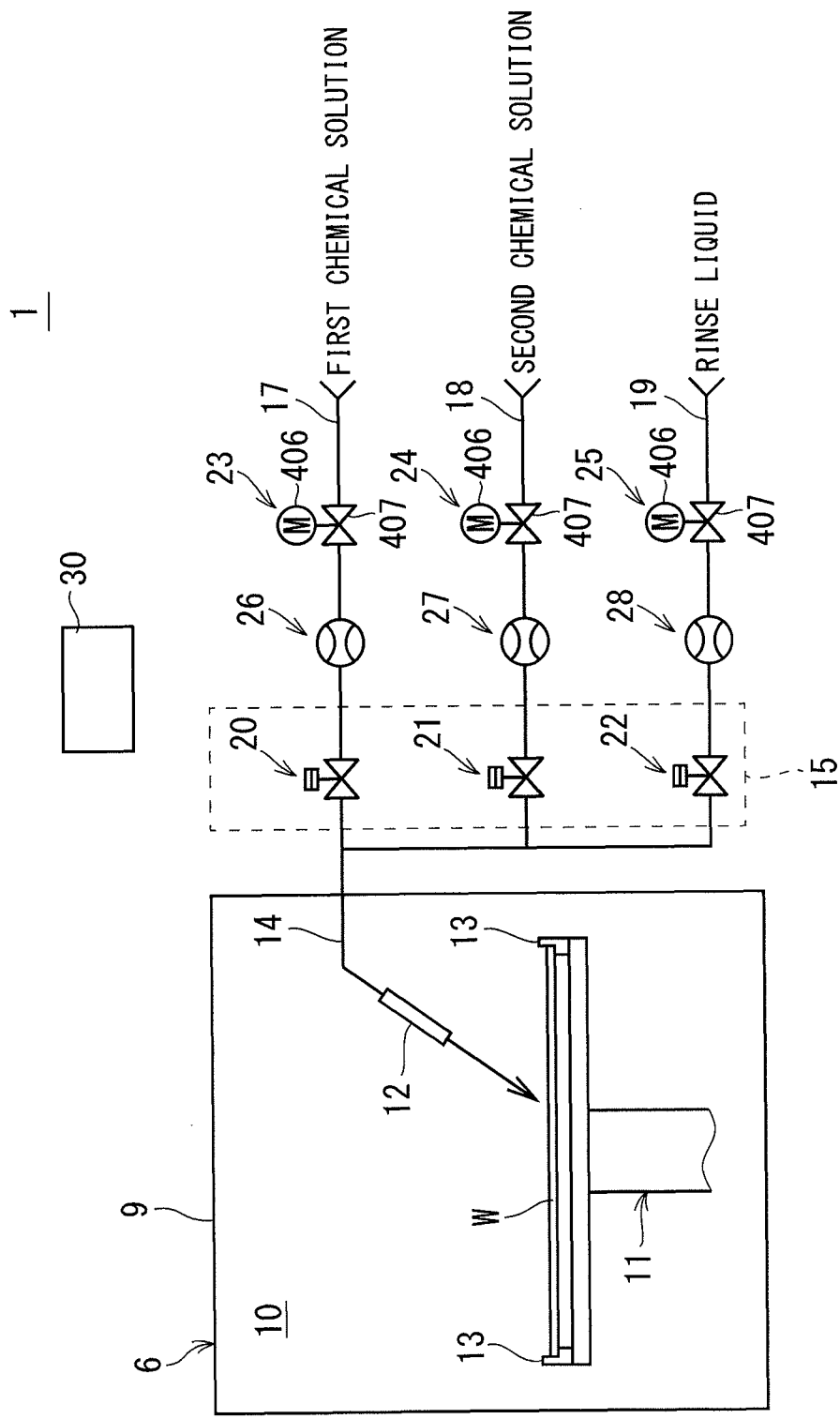
FIG. 1 is a schematic diagram illustrating a schematic configuration of a treatment unit 6.

FIG. 1 is a schematic diagram illustrating a schematic configuration of a treatment unit 6.

A substrate treatment apparatus 1 is a single wafer apparatus, which treats substrates W such as semiconductor wafers one by one, and includes: a plurality of treatment units 6; a conveying robot CR (FIG. 3) capable of conveying the substrates W to the respective treatment units 6; and a master device 30 that performs device control of the substrate treatment apparatus 1. Therefore, the conveying robot CR carries an untreated substrate W into any of the treatment units 6, carries a treated substrate W out of the treatment unit 6, and can thereby implement substrate treatment sequentially for a plurality of the substrates W.

In a treatment chamber 10 defined by a partition 9, the treatment unit 6 includes: a gripping portion 13 that grips the substrate W; a spin chuck 11 that rotates the substrate W, which is gripped by the gripping portion 13, about a vertical axial line thereof; and a treatment liquid nozzle 12 for supplying a treatment liquid onto an upper surface of the substrate W held by the spin chuck 11.

The treatment liquid nozzle 12 is arranged above the spin chuck 11 in a state of turning a discharge port thereof downward. The treatment liquid nozzle 12 can discharge the treatment liquid, which is supplied from a treatment liquid supply pipe 14, toward the upper surface of the substrate W held by the spin chuck 11.

At a time of treating the substrate W in the treatment unit 6, for example, a chemical solution as a treatment liquid is continuously discharged from the treatment liquid nozzle 12 toward a center portion of the upper surface of the substrate W while holding and rotating the substrate W by the spin chuck 11. The chemical solution discharged from the treatment liquid nozzle 12 reaches the center portion of the upper surface of the substrate W, receives centrifugal force by rotation of the substrate W, and instantaneously spreads toward a peripheral edge portion of the upper surface of the substrate W. In this way, the chemical solution is supplied to an entire region of the upper surface of the substrate W, and treatment by the chemical solution is performed for the upper surface of the substrate W. After the treatment by the chemical solution is performed, a rinse liquid as a treatment liquid is supplied from the treatment liquid nozzle 12 to the upper surface of the substrate W in a rotated state, and the chemical solution on the substrate W is washed away. Then, the substrate W is rotated at a high speed by the spin chuck 11, whereby the substrate W is dried.

To an upstream end portion of the treatment liquid supply pipe 14, a plurality of pipes are connected, and the treatment liquid is supplied to the treatment liquid supply pipe 14 from each of these pipes. In this preferred embodiment, a first chemical solution supply pipe 17, a second chemical solution supply pipe 18 and a rinse liquid supply pipe 19 are connected to the upstream end portion of the treatment liquid supply pipe 14.

Valve control units 20 to 22 are interposed into the pipes 17 to 19, respectively. In this preferred embodiment, the valve control units 20 to 22 function as a mixing valve 15. The mixing valve 15 can mix the treatment liquids, which are supplied from two or more pipes among the pipes 17 to 19, with one another in an inside thereof, and can supply the mixed treatment liquids to the treatment liquid supply pipe 14. For example, valves are turned to an open state by the valve control units 20 and 21, whereby a first chemical solution and a second chemical solution can be mixed with each other by the mixing valve 15, and a mixed solution of these chemical solutions can be supplied to the treatment liquid supply pipe 14. The mixing valve 15 can supply the treatment liquid, which is supplied from one of the pipes 17 to 19, to the treatment liquid supply pipe 14. Open and close of the mixing valve 15 (open and close of the respective valve control units 20 to 22) are controlled by the master device 30.

Moreover, valve control units 23 to 25 and flowmeters 26 to 28 are interposed into the pipes 17 to 19, respectively. The valve control units 23 to 25 adjust flow rates of the treatment liquids, which flow through the pipes, by needle valves 407. The flowmeters 26 to 28 (for example, ultrasonic flowmeters) measure the flow rates of the treatment liquids flowing through the pipes. Then, feedback control is performed, in which valve openings of the respective needle valves 407 are adjusted by the valve control units 23 to 25 based on values of the flow rates.

The needle valves 407 are electric valves capable of changing the openings thereof by motors 406 (actuators). The flowmeters 26 to 28 are arranged downstream of the needle valves 407 of the valve control units 23 to 25 with respect to a flowing direction of the treatment liquids.

The valve control units 23 to 25 capture such flow rate values, which are outputted from the flowmeters 26 to 28 (measuring slaves), respectively by a method to be described later, and control the motors 406 based on the flow rate value. In this way, the valve control units 23 to 25 can change such a supply flow rate of each of the treatment liquids, which is sent to the treatment liquid nozzle 12, within a range of flow rate adjustment of the needle valves 407.

Figure 2:
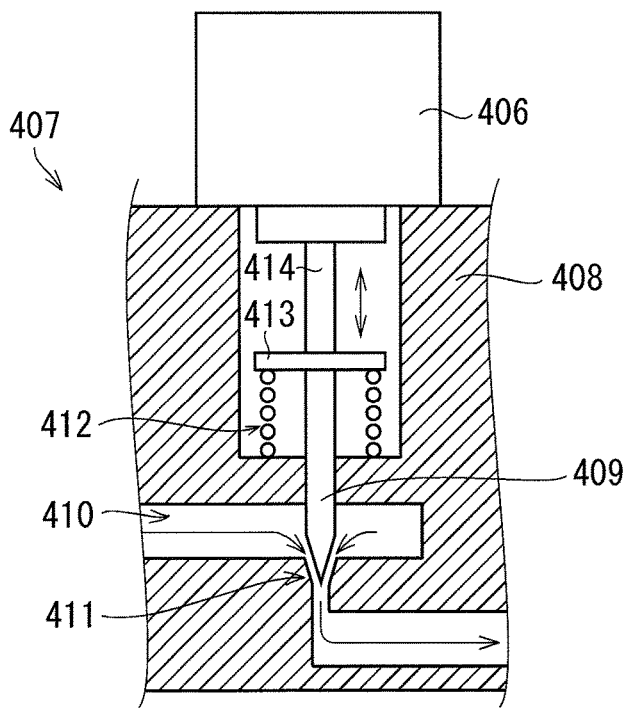
FIG. 2 is a cross-sectional diagram illustrating a schematic configuration of a needle valve 407.

FIG. 2 is a cross-sectional diagram illustrating a schematic configuration of an internal structure of each of the needle valves 407.

The needle valve 407 includes a body 408 and a needle 409, and is connected to the motor 406 mentioned above. In the body 408, a flow passage 410 which the treatment liquid flows in, and in a middle portion of the flow passage 410, a valve seat 411 on which the needle 409 is seated is provided. Portions of the body 408 and the needle 409, which are brought into contact with the treatment liquid, are formed of a material (for example, synthetic resin), which has resistance against the treatment liquid, and is less likely to be deformed by a temperature change. In this way, the opening of the needle valve 407 can be suppressed or prevented from being changed owing to swelling by the treatment liquid and to deformation by the temperature change.

The needle 409 is arranged above the valve seat 411 in an attitude in which a center axial line thereof becomes vertical. The needle 409 is held by the body 408 so as to be movable up and down so that a tip end portion (lower end portion in FIG. 3) thereof can approach and leave the valve seat 411. The tip end portion of the needle 409 has, for example, a conic shape that is tapered, and can be seated on the valve seat 411 and close the flow passage 410. A position of the needle 409 with respect to the valve seat 411 is controlled, whereby a flow passage cross-sectional area between the needle 409 and the valve seat 411 can be adjusted, and a flow rate of the treatment liquid flowing downstream of the valve seat 411 can be adjusted.

Moreover, a coil spring 412 is fitted to an upper end portion of the needle 409 from an outside. The coil spring 412 is held between the body 408 and a brim portion 413 provided on an upper end of the needle 409. When the needle 409 moves downward from an original position, the coil spring 412 is elastically deformed, and the needle 409 is urged to the original position. The original position of the needle 409 is set at a position, where the tip end portion of the needle 409 leaves the valve seat 411, and the flow passage 410 is opened.

The motor 406 is located above the needle 409, and is held by the body 408 in an attitude in which a center axial line thereof becomes vertical. Onto the motor 406, a screw shaft 414, in which a screw portion (not shown) is formed, is attached. The screw shaft 414 is arranged between the needle 409 and the motor 406 in an attitude in which a center axial line thereof becomes vertical. The screw shaft 414 receives turning force coming from the motor 406, and goes up and down while rotating about the center axial line thereof.

The screw shaft 414 is rotated and lowered by the motor 406, whereby the brim portion 413 can be pushed downward by a lower end portion of the screw shaft 414, and the needle 409 can be lowered. The needle 409 is lowered, whereby, while elastically deforming the coil spring 412, the tip end portion of the needle 409 can be brought close to the valve seat 411, and the flow passage cross-sectional area between the needle 409 and the valve seat 411 can be reduced. In this way, the flow rate of the treatment liquid can be reduced.

Moreover, the screw shaft 414 is raised from such a state where the needle 409 is pushed downward by the screw shaft 414, whereby the needle 409 can be raised by resilience of the coil spring 412, and the tip end portion of the needle 409 can be left from the valve seat 411. In this way, the flow passage cross-sectional area between the needle 409 and the valve seat 411 can be increased, and the flow rate of the treatment liquid can be increased. Moreover, a turning angle of the motor 406 is adjusted by a motor driver 405 (FIG. 4).

In this preferred embodiment, in each of the treatment units 6, the opening and closing of the mixing valve 15 and the adjustment of the opening angle of each of the needle valves 407 are linked with each other, whereby a supply ratio of each of the treatment liquids can be adjusted, and the adjusted treatment liquid (single type of treatment liquid or a mixed treatment liquid of plural types thereof) can be supplied to the treatment liquid nozzle 12.

<1.2 Electrical Configuration of Substrate Treatment Apparatus 1>

Figure 3:
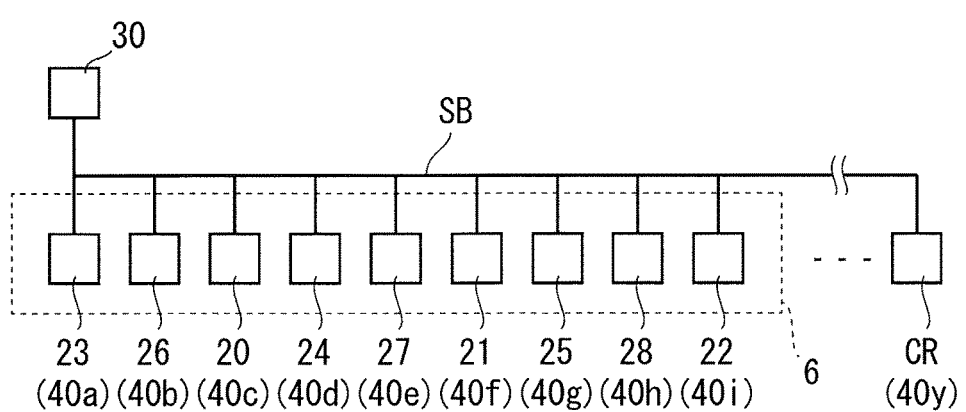
FIG. 3 is a block diagram illustrating an electrical configuration of a substrate treatment apparatus 1.

FIG. 3 is a block diagram illustrating a state where the master device 30 is connected by a serial bus SB to a plurality of slave devices 40a to 40y (lower control elements) placed as a control hierarchy relatively lower than the master device 30 in a control system of the substrate treatment apparatus 1. FIG. 4 is a block diagram illustrating an electrical configuration of the slave device 40a (valve control unit 23).

Note that the slave device 40a is configured as a "master-slave complex system" that has not only a slave IC 400a but also a master IC 401 (FIG. 4). Therefore, the slave device 40a is not a simple slave device that does not have such a master IC (master function) but only has such a slave IC (slave function); however, for convenience of the description, the slave device 40a is also referred to as a "slave device" in a similar way to the other slave devices 40b to 40y. The upper master device 30 has a master function in an overall (global) control system of the substrate treatment apparatus 1, and meanwhile, the lower master IC 401 has a master function in a local control system to be used for control for a specific portion such as the flowmeter 26 (details will be described later).

As shown in FIG. 3, to the master device 30, the valve control units 20 to 25 and the flowmeters 26 to 28 are connected as the slave devices for each of the treatment units 6. Moreover, to the master device 30, other constituents (for example, the conveying robot CR and the like) of the substrate treatment apparatus 1 are connected as the slave devices.

In this preferred embodiment, the master device 30 and the plurality of slave devices 40*a* to 40*y* are connected to each other by a so-called master-slave method. Specifically, such a connection configuration is as follows.

As shown in FIG. 4, the master device 30 includes a master IC 300. On the other hand, the respective slave devices 40*a* to 40*y* include slave ICs 400*a* to 400*y*, respectively (slave ICs 400*b* to 400*y* are not shown). In this specification, the slave ICs 400*a* to 400*y* and a slave IC 400*z* to be described later are simply referred to as "slave ICs" collectively.

A specific identification number is not assigned to the master IC 300, and specific identification numbers (slave addresses) are individually assigned to the respective slave ICs. In an event where a signal is transferred on the serial bus SB, each of the slave addresses is expressed by, for example, a 7-bit binary number.

The master IC 300 contains the slave address of the slave IC, which is a target of communication, in a part (for example, a header or the like) of the signal, and thereby becomes capable of transferring the signal to each of the slave ICs. Each of the slave ICs receives the signal transferred from the master IC 300, and transmits a strobe signal in a case where the slave address contained in the signal and the slave address of itself coincide with each other. The strobe signal is a signal to be used in an inside of the slave device in which the slave IC is arranged, and the strobe signal is used for the purpose of achieving synchronization. Details of the strobe signal will be described later while referring to FIG. 5.

The slave IC that has received the signal transferred from the master IC 300 transfers a signal to other respective units (master IC 300, other ICs in the slave device, and the like) in response to the transferred signal. For example, when a signal that makes a request for flow rate data is transferred from the master IC 300 of the master device 30 to the slave IC 400*b* of the flowmeter 26 (slave device 40*b*) of a predetermined treatment unit 6, the flowmeter 26 transmits a measurement result of the flow rate as a flow rate data signal (measured data signal), which is readable by the master IC 300 (first master), to the serial bus SB.

On the other hand, the slave IC that has not received the signal transferred from the master IC 300 cannot spontaneously transfer the signal therefrom to the other respective units. That is to say, in a case where a command from the master IC 300 does not agree to the slave address of each of the slave ICs, the slave IC maintains a standby state thereof without transmitting the signal.

Such a configuration is adopted, and accordingly, a load applied to a CPU that controls the master IC 300 is increased by an increase of the slave devices controlled by the master device 30 (that is, for example, an increase of the valve control units 20 to 25, an increase of the flowmeters 26 to 28, and the like, which follow the increase of the treatment units 6). Hence, for example, in such feedback control in which the flow rate data signals outputted from the flowmeter 26 are transferred to the master device 30, and further, the flow rate data signals are transferred from the master device 30 to the valve control unit 23, whereby the valve control unit 23 controls the valve openings, the feedback control being made through the master device 30, it has been difficult to ensure real time properties.

While referring to FIG. 4 and FIG. 5, a description is made below of a configuration capable of ensuring the real time properties of the flow rate control in each of the treatment units 6 while reducing the load applied to the CPU that controls the master IC 300.

As shown in FIG. 4, the slave device 40*a* includes the slave IC 400*a*, the master IC 401, the slave IC 400*z*, a CPU 403, the motor driver 405, the motor 406, and the needle valve 407. A description is made below of functions of the respective units.

The slave IC 400*a* is a portion having a communication control unit, and is communicably connected to the master IC 300 (first master) by the serial bus SB. In the following, the slave addresses of the slave ICs 400*a* to 400*z* are referred to as "address a" to "address z" for convenience of the description.

The slave IC 400*a* is an adjustment-instructed slave that receives an instruction signal from the master IC 300 regarding flow rate adjustment of the treatment liquid. Feedback control for the flow rate adjustment in this preferred embodiment is started in such a manner that an instruction signal to instruct the feedback control is transferred from the master IC 300 to the slave IC 400*a*, and that the slave IC 400*a* responds thereto. The instruction signal is transferred from the slave IC 400*a* to the CPU 403.

The master IC 401 (second master) is configured so as to have a similar function to that of the master IC 300 (first mater). Therefore, the master IC 401 is configured so as to be communicable with the respective slave ICs 400*a* to 400*z*. In this preferred embodiment, the master IC 401 reads the respective signals, which are transmitted onto the serial bus SB from the respective slave ICs 400*a* to 400*z*, simultaneously with the master IC 300. The respective signals read by the master IC 401 are transferred to the CPU 403.

As described above, the master IC 401 reads the respective signals, which are transmitted onto the serial bus SB, in a similar way to the master IC 300 as the first master; however, does not give instructions to the respective slave ICs like the master IC 300. It is sufficient if the master IC 401 is capable of reading the respective signals transmitted onto the serial bus SB, and it is not necessary that the master IC 401 have a similar configuration to that of the master IC 300. In this preferred embodiment, in order to simplify the description, the description is made on the assumption that the master IC 300 and the master IC 401 are composed of the same IC circuit.

The slave IC 400*z* is a portion having a communication control unit, and is communicably connected to the master IC 300 by the serial bus SB.

The slave IC 400*z* is a shadow slave IC, and does not transfer the signal therefrom toward the master IC 300 even in a case where the signal is transferred from the master IC 300 to the slave IC 400*z*. The slave IC 400*z* (selecting slave) only has a function to transmit the strobe signal in response to reception of the signal transferred from the master IC 300 toward the address z in a case of having received the signal concerned. The strobe signal is transferred to the CPU 403.

As described above, besides the slave IC 400*a*, the slave device 40*a* includes the master IC 401 and the slave IC 400*z* as constituents to be directly connected to the serial bus SB.

The CPU 403 has a function to select one signal, which is necessary to control the needle valve 407, from among the plurality of signals read by the master IC 401 (that is, the plurality of signals transferred on the serial bus SB). As shown in FIG. 1 and FIG. 3, the signal necessary to control the needle valve 407 in the valve control unit 23 (slave device 40*a*) is the flow rate data signal transmitted from the flowmeter 26 (slave device 40*b*), which is provided in the same treatment unit 6 and is interposed into the pipe corresponding to the needle valve 407. Therefore, the CPU 403 selects the above-described flow rate data signal from among the plurality of signals read by the master IC 401.

A description is made of a method for selecting the above-described flow rate data signal by the CPU 403.

Figure 5:
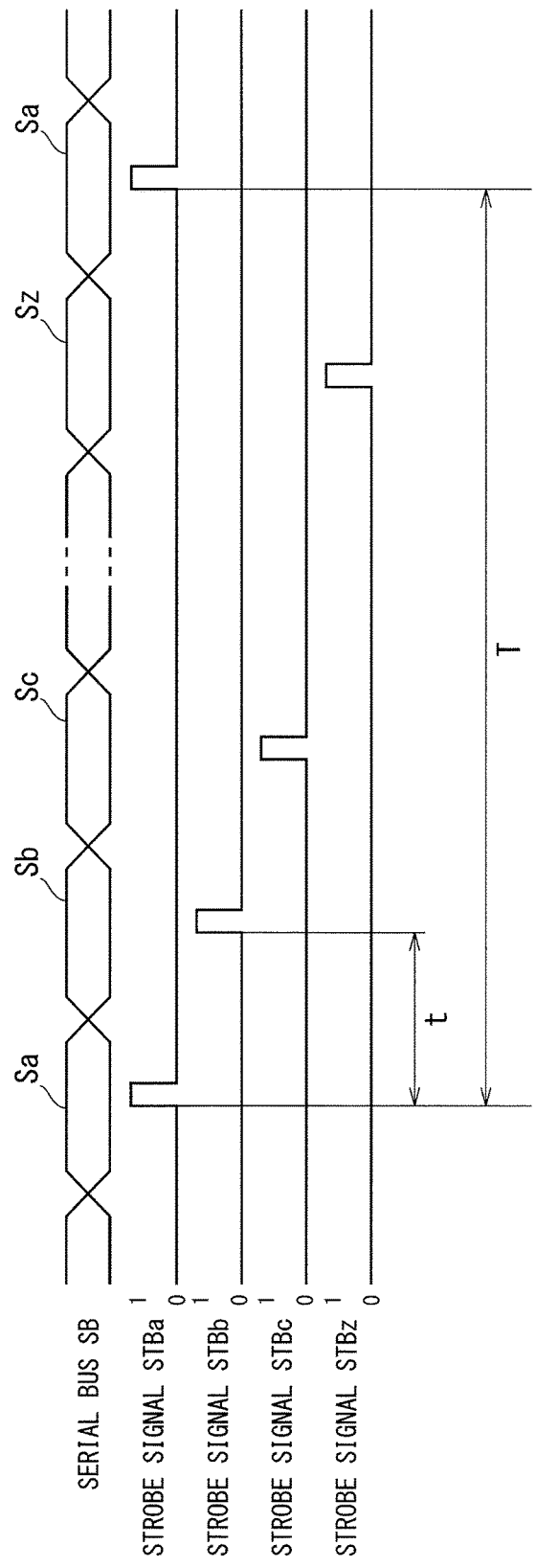
FIG. 5 is a time chart of signals transferred by the substrate treatment apparatus 1.

FIG. 5 is a time chart illustrating relationships between signals Sa to Sz, which are transferred on the serial bus SB, and strobe signals STBa to STBz, which are transmitted by the respective slave ICs 400*a* to 400*z*. The signal Sa stands for a signal transferred between the master IC 300 and the slave IC 400*a*. In a similar way, the signals Sb to Sz stand for signals transferred between the master IC 300 and the slave ICs 400*b* to 400*z*. Moreover, the strobe signal STBa stands for a strobe signal transmitted by the slave IC 400*a*. In a similar way, the signals STBb to STBz stand for strobe signals transmitted by the slave ICs 400*b* to 400*z*.

The CPU 403 selects the above-described flow rate data signal (signal Sb) from among the signals Sa to Sz, which are read by the master IC 401, based on transfer timing of the respective signals Sa to Sz on the serial bus SB.

As shown in FIG. 5, in this preferred embodiment, communication time periods between the respective slave ICs 400*a* to 400*z* and the master IC 300 are equal to one another, and the respective slave ICs 400*a* to 400*z* communicate with the master IC 300 sequentially in time order. In this case, a time interval t between timing when a certain slave IC communicates with the master IC 300 and timing when the slave IC with the next address communicates with the master IC 300 becomes a value obtained by dividing, by a total number of the slave ICs 400*a* to 400*z*, a time interval T (all slave circulation cycle) between the timing when the certain slave IC communicates with the master IC 300 and timing when the same slave IC communicates with the master IC 300 next time.

As already mentioned, the CPU 403 has received the strobe signal STBz transferred from the slave IC 400*z*, and accordingly, the CPU 403 can obtain an interval (time interval T) between a point of transmission time of the transferred strobe signal STBz and a point of transmission time of the transferred strobe signal STBz. Moreover, to the CPU 403, a signal including the total number of slave ICs 400*a* to 400*z* is sent from the master IC 300.

Therefore, the CPU 403 can calculate the time interval t as described above by dividing the time interval T by the total number of the slave ICs 400*a* to 400*z*.

Furthermore, the slave address (address b) of the slave device 40*b*, which transmits the signal (signal Sb) necessary for the CPU 403 to capture for the feedback control, is sent from the master IC 300 to the CPU 403 in advance.

As shown in FIG. 5, at a point of time when the time interval t has elapsed since the point of transmission time of the strobe signal STBz, the signal Sa is transferred on the serial bus SB. Moreover, at a point of time when 2×(time interval t) has elapsed since the point of transmission time of the strobe signal STBz, the signal Sb is transferred on the serial bus SB. In a similar way, points of time when the other signals Sc to Sz are transferred on the serial bus SB can also be calculated based on the point of transmission time of the strobe signal STBz and the time interval t.

The CPU 403 calculates at which timing the signal Sb is transmitted onto the serial bus SB based on the point of transmission time of the strobe signal STBz, the time interval t, and the address b of the slave IC 40*b* serving as a target of the signal capturing, and selects the flow rate data signal (signal Sb) from among the signals Sa to Sz transferred from the master IC 401.

As described above, the CPU 403 functions as a selection unit, which determines serial transfer timing of the respective signals Sa to Sz read by the master IC 401 based on the strobe signal STBz, and selects the flow rate data signal (signal Sb) from among the respective signals Sa to Sz. Moreover, a function unit realized by the master IC 401, the slave IC 400*z* and the CPU 403 is referred to as a data reading/selecting unit 500.

Then, the CPU 403 performs an arithmetic operation based on the flow rate data signal (signal Sb) selected and captured by the above-described function of the data reading/selecting unit 500, and generates a control signal for the needle valve 407 (adjustment unit). The generated control signal is transferred from the CPU 403 to the motor driver 405.

The motor driver 405 (adjustment control unit) drives the motor 406 based on the above-described control signal given from the CPU 403 (arithmetic operation unit), and adjusts the opening of the needle valve 407.

Note that, in this preferred embodiment, the respective elements of the control system (master-slave complex system) for the needle valve 407, which is composed of the slave IC 400*a*, the data reading/selecting unit 500 and the motor driver 405, are packaged on a single control board 600.

Figure 6:
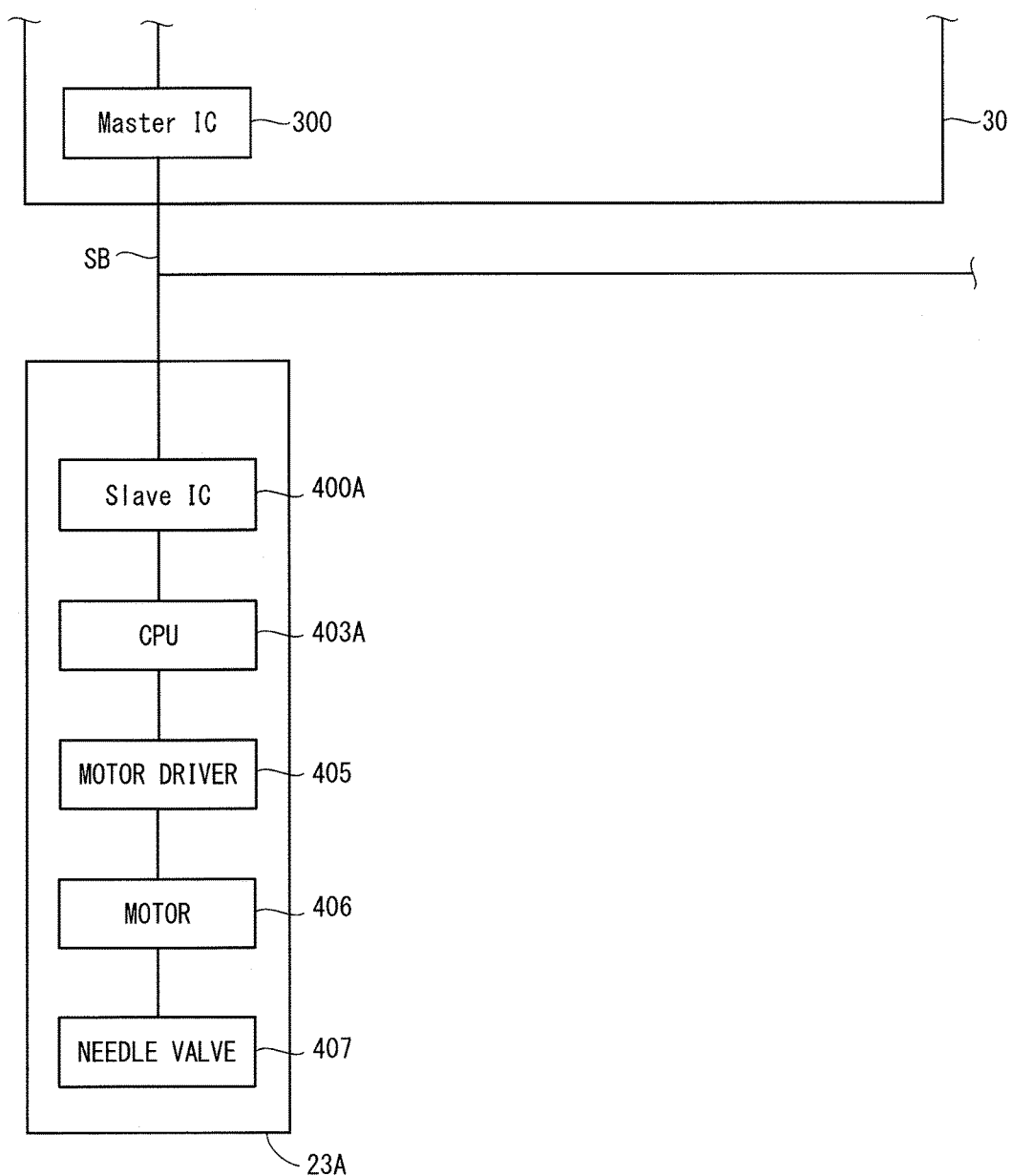
FIG. 6 is a block diagram illustrating an electrical configuration of a valve control unit 23A according to a comparative example.

FIG. 6 is a block diagram illustrating an electrical configuration of the valve control unit 23A according to a comparative example.

The valve control unit 23A includes a slave IC 400A, a CPU 403A, the motor driver 405, the motor 406, and the needle valve 407. As described above, the valve control unit 23A does not include a constituent equivalent to the data reading/selecting unit 500. Therefore, even if the flow rate data signal (signal Sb) is transferred on the serial bus SB from the slave IC 400*b* toward the master IC 300, the valve control unit 23A cannot capture the signal at the same time when the master device 30 captures the signal.

Hence, in this comparative example, in a case of performing the above-described feedback control, the flow rate data signal (signal Sb) is first transferred from the slave IC 400*b* to the master IC 300, and thereafter, the signal is transferred from the master IC 300 to the slave IC 400A only when it is timing when the instruction signal is transmitted from the master IC 300 to the slave IC 400A.

In the valve control unit 23 of this preferred embodiment, it is not necessary to perform such signal transfer via the master IC 300 as in the valve control unit 23A, and accordingly, the load applied to the CPU that controls the master IC 300 can be reduced. As a result, irrespective of a processing status of the CPU that controls the master IC 300, it is made possible to ensure the real time properties of the flow rate control in each of the treatment units 6.

Figure 7:
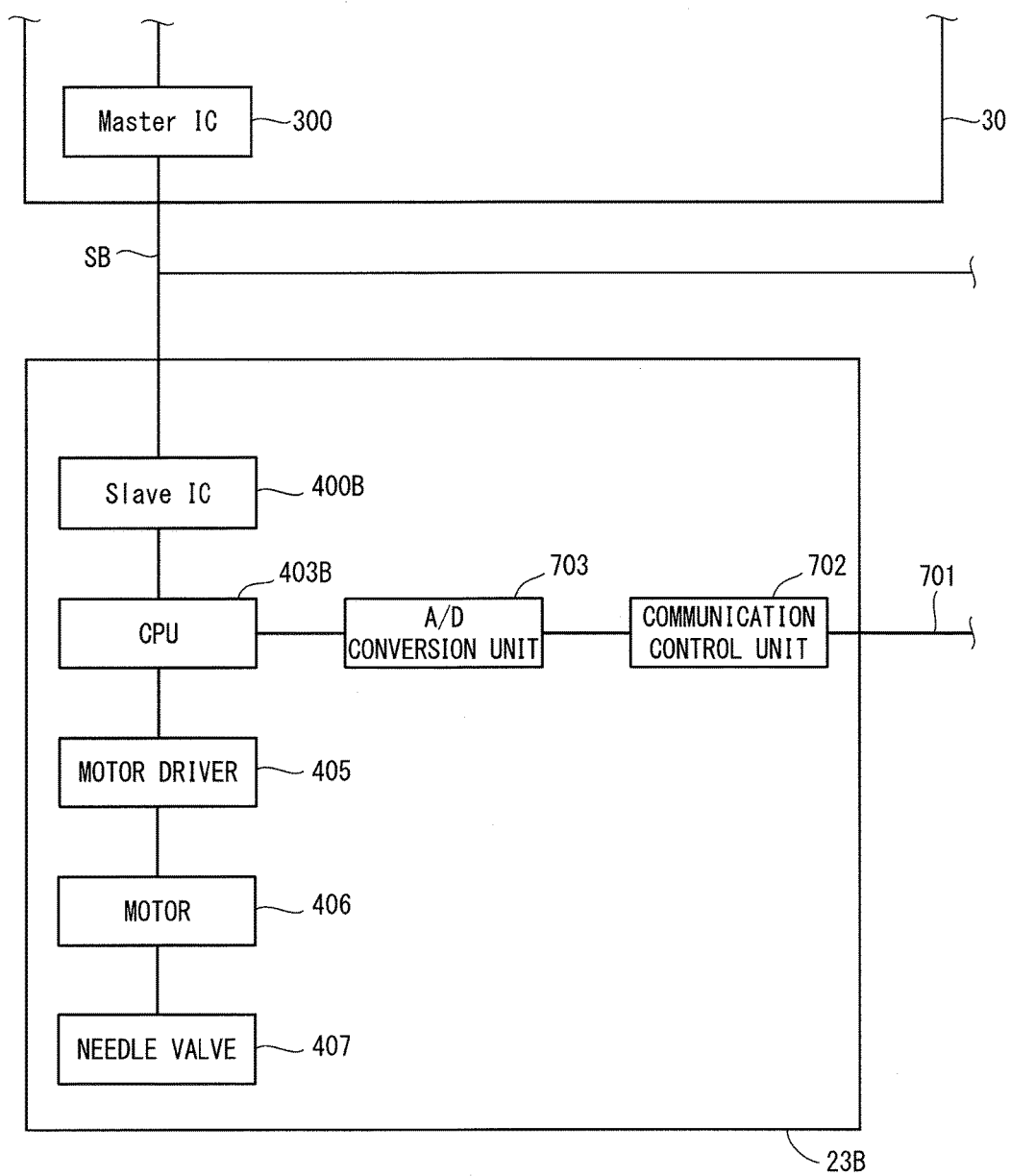
FIG. 7 is a block diagram illustrating an electrical configuration of a valve control unit 23B according to a comparative example.

FIG. 7 is a block diagram illustrating an electrical configuration of the valve control unit 23B according to the comparative example.

The valve control unit 23B includes a slave IC 400B, a CPU 403B, the motor driver 405, the motor 406, the needle valve 407, a communication control unit 702, and an A/D conversion unit 703. As described above, the valve control unit 23B does not include a constituent equivalent to the data reading/selecting unit 500. Therefore, even if the flow rate data signal (signal Sb) is transferred on the serial bus SB from the slave IC 400b toward the master IC 300, the valve control unit 23B cannot capture the signal at the same time when the master device 30 captures the signal.

In this comparative example, in a case of performing the above-described feedback control, a flow rate data signal (analog signal) is first transferred from the flowmeter 26 to the valve control unit 23B through a signal line 701. The flow rate data signal transferred to the valve control unit 23B is transferred to the A/D conversion unit 703 via the communication control unit 702. Thereafter, after the flow rate data signal is converted into a digital signal by the A/D conversion unit 703, such a flow rate data signal (digital signal) is transferred to the CPU 403B.

In this mode, it is made possible to ensure the real time properties of the flow rate control in each of the treatment units 6 while reducing the load applied to the CPU that controls the master IC 300, and meanwhile, there occur problems that an error by digital/analog conversion occurs without fail, that a delay of the data transfer, which follows the digital/analog conversion, occurs, that it becomes necessary to provide additional instruments (signal line 701, communication control unit 702, A/D conversion unit 703 and the like) for transferring the analog signal, and the like.

In the valve control unit 23 of this preferred embodiment, such problems of the error and the delay as mentioned above do not occur. Moreover, the data reading/selecting unit 500 is packaged on a control board 600 of the valve control unit 23, whereby the flow rate data signal can be captured through the serial bus SB, and it is not necessary to provide such additional instruments large in size, and accordingly, it is made possible to realize miniaturization of the apparatus. Moreover, in general, the mode of providing the data reading/selecting unit 500 as in this preferred embodiment becomes more inexpensive in comparison with the mode of providing the additional instruments for transferring the analog signal.

2. Second Preferred Embodiment

FIG. 8 is a block diagram illustrating an electrical configuration of a valve control unit 23C according to a second preferred embodiment. A substrate treatment apparatus of the second preferred embodiment includes a valve control unit 23C in place of the valve control unit 23 of the substrate treatment apparatus 1 of the first preferred embodiment. Other respective units of the substrate treatment apparatus of the second preferred embodiment are similar to those of the first preferred embodiment, and accordingly, the same reference numerals are assigned to the same portions as those in the first preferred embodiment in the following description, and a duplicate description is omitted.

The valve control unit 23C includes a slave IC 400a, the master IC 401, a CPU 403C, the motor driver 405, the motor 406, and the needle valve 407.

As already mentioned, the master IC 401 reads the respective signals Sa to Sz, which are transmitted onto the serial bus SB from the respective slave ICs of the respective slave devices 40a to 40y, simultaneously with the master IC 300.

In the second preferred embodiment, pieces of address information (slave addresses) of such transmission sources are included in the respective signals Sa to Sz transmitted from the respective slave ICs onto the serial bus SB.

The respective signals Sa to Sz read by the master IC 401 are transferred to the CPU 403C. The CPU 403C receives the respective signals Sa to Sz from the master IC 401, and selects a signal, which includes the address information (address b) of the slave device 40b, as the flow rate data signal (signal Sb) from among the respective signals Sa to Sz. As described above, the CPU 403C functions as a selection unit, which selects the flow rate data signal (signal Sb) from among the respective signals Sa to Sz transferred from the master IC 401. Moreover, a function unit realized by the master IC 401 and the CPU 403C is referred to as a data reading/selecting unit 500C.

When the flow rate data signal (signal Sb) selected by the CPU 403C is transferred from the CPU 403C to the motor driver 405, then in a similar way to the first preferred embodiment, the motor 406 is driven by the motor driver 405, and the opening of the needle valve 407 is adjusted. In the second preferred embodiment, the respective elements of the control system (master-slave complex system) for the needle valve 407, which is composed of the slave IC 400a, the data reading/selecting unit 500C and the motor driver 405, are packaged on a single control board 600C.

In the valve control unit 23C of the second preferred embodiment, it is not necessary to perform such signal transfer via the master IC 300 as in the comparative example shown in FIG. 6, and accordingly, it is made possible to ensure the real time properties of the flow rate control in each of the treatment units 6 while reducing the load applied to the CPU that controls the master IC 300.

Moreover, in the valve control unit 23C of the second preferred embodiment, the data reading/selecting unit 500C is packaged on a control board 600C of the valve control unit 23, whereby the flow rate data signal can be captured through the serial bus SB. Therefore, it is not necessary to provide the additional instruments large in size as in the comparative example shown in FIG. 7, and the size increase and cost increase of the apparatus can be suppressed.

Note that, in the second preferred embodiment, it becomes necessary to record all of the signals Sa to Sz transferred from the respective slave ICs onto the serial bus SB, and to sort out and select the flow rate data signal (signal Sb) from among the signals Sa to Sz by the CPU 403C. Therefore, the load applied to the master IC 401 and the CPU 403C is increased in comparison with the first preferred embodiment.

Moreover, in such a case where the signal transferred from a part of the slave ICs is encrypted among the signals transferred onto the serial bus SB, the load to the CPU 403C is further increased.

3. Modification Example

The description has been made above of the first preferred embodiment and second preferred embodiment of the present invention; however, the present invention is changeable in various ways besides the above-mentioned ones within the scope without departing from the spirit thereof.

In the above-described respective preferred embodiments, the description has been made of the substrate treatment apparatus that adjusts the flow rate; however, the present invention is not limited to this. The present invention can be applied to a variety of substrate treatment apparatuses which perform the feedback control, each of which includes: a measuring slave that measures, as an index value, at least one physical quantity regarding an operation state of substrate treatment; and an adjustment unit that adjusts the above-described operation state based on a measurement result by the measuring slave.

In the above-described respective preferred embodiments, the description has been made of the mode in which the operation state is the state of the treatment liquid (specific fluid) in the substrate treatment, the index value is the flow rate value of the fluid, the measuring slave is the flowmeter, and the adjustment unit is the valve that adjusts the flow rate value.

Besides, for example, there may be adopted a mode in which the operation state is a state of a specific fluid in the substrate treatment, the index value is a pressure value of the fluid, and the measuring slave is a pressure gauge. In this case, as the adjustment unit, for example, a damper that adjusts a pressure value can be adopted.

Moreover, there may be adopted a mode in which the operation state is the state of the specific fluid in the substrate treatment, the index value is a difference between pressure values of the fluid at a plurality of spots, and the measuring slave is a differential pressure gauge. Also in this case, as the adjustment unit, for example, the damper that adjusts the pressure value can be adopted.

Moreover, there may be adopted a mode in which the operation state is a state of rotation of the substrate in the substrate treatment, the index value is a speed of rotation of the substrate, and the measuring slave is a mode in which the measuring slave is a rotary encoder. In this case, as the adjustment unit, for example, there can be adopted a servo motor of the spin chuck that holds the substrate and rotates the substrate about such a rotation axis thereof.

Moreover, there may be adopted a mode in which the operation state is the state of the specific fluid in the substrate treatment, the index value is a temperature of the fluid, and the measuring slave is a thermometer (for example, a thermocouple and the like). In this case, as the adjustment unit, for example, a heat regulation unit (for example, a heater, a cooler, a hot plate and the like) that adjusts the temperature can be adopted.

Moreover, the description has been made of the configuration in which only the valve control unit 23 includes the data reading/selecting unit 500 in the above-described first preferred embodiment, and the description has been made of the configuration in which only the valve control unit 23C includes the data reading/selecting unit 500C in the above-described second preferred embodiment; however, the present invention is not limited to this. A configuration in which the plurality of slave devices include the data reading/selecting units may be adopted.

Moreover, in each of the above-described preferred embodiments, the description has been made of the mode of using the needle valve 407 as the adjustment unit; however, besides, a variety of members such as an air valve, a suck back valve and a butterfly valve are usable.

The description has been made above of the substrate treatment apparatuses according to the preferred embodiments and the modification example; however, these are examples of the preferred embodiment for the present invention, and do not limit the scope of implementation of the present invention. Within the scope of the present invention, the present invention is capable of free combination of the respective preferred embodiments, or modification of arbitrary constituent elements of each of the preferred embodiments, or omission of the arbitrary constituent elements of each of the preferred embodiments.

While the invention has been shown and described in detail, the foregoing description is in all aspects illustrative and not restrictive. It is therefore understood that numerous modifications and variations can be devised without departing from the scope of the invention.

What is claimed is:

1. A substrate treatment apparatus comprising:
   (a) a first master that performs apparatus control for said substrate treatment apparatus; and
   (b) a plurality of lower control elements placed as relatively lower control hierarchies than said first master and configured to communicate with said first master through a bus and to send signals over said bus,
   wherein each of said plurality of lower control elements includes:
   (b-1) a measuring slave that measures, as an index value, at least one physical quantity regarding an operation state of substrate treatment, and transmits to said bus a measurement result of the physical quantity as a measured data signal, which is readable by said first master;
   (b-2) a master-slave complex system provided as a control system for an adjustment unit that adjusts said operation state;
   wherein said master-slave complex system includes:
      an adjustment-instructed slave that receives an instruction signal from said first master regarding adjustment of said operation state;
      a data reading/selecting unit including a second master that reads said signals, transmitted to said bus from said lower control elements, simultaneously with said first master, said data reading/selecting unit selecting said measured data signal included among said signals;
      an arithmetic operation unit that performs an arithmetic operation based on said measured data signal and generates a control signal for said adjustment unit; and
      an adjustment control unit that controls said adjustment unit based on said control signal provided from said arithmetic operation unit.

2. The substrate treatment apparatus according to claim 1, wherein said data reading/selecting unit includes:
   said second master;
   a selecting slave that is communicable with said first master through said bus and transmits a strobe signal in response to communication with said first master; and
   a selection unit that receives each of said signals from said second master, receives said strobe signal from said selecting slave, determines serial transmission timing of each of said signals based on said strobe signal, and selects said measured data signal from among said signals.

3. The substrate treatment apparatus according to claim 1, wherein address information of a transmission source of each of said signals is included in each of said signals, and
   said data reading/selecting unit includes:
   said second master; and a selection unit that receives each of said signals from said second master and selects, as said measured data signal, a signal including address information of said measuring slave among said signals.

4. The substrate treatment apparatus according to claim 1, wherein said operation state is a state of a specific fluid in said substrate treatment, and
   said index value is a flow rate value of said fluid, and said measuring slave is a flowmeter.

5. The substrate treatment apparatus according to claim 4, wherein said adjustment unit is a valve that adjusts said flow rate value.

6. The substrate treatment apparatus according to claim 1,
wherein said operation state is a state of a specific fluid in said substrate treatment, and
said index value is a pressure value of said fluid, and said measuring slave is a pressure gauge.

7. The substrate treatment apparatus according to claim 6,
wherein said adjustment unit is a damper that adjusts said pressure value.

8. The substrate treatment apparatus according to claim 1,
wherein said operation state is a state of a specific fluid in said substrate treatment, and
said index value is difference between pressure values of said fluid at a plurality of spots, and said measuring slave is a differential pressure gauge.

9. The substrate treatment apparatus according to claim 8,
wherein said adjustment unit is a damper that adjusts said pressure values.

10. The substrate treatment apparatus according to claim 1,
wherein each element of said master-slave complex system is packaged on a single control board.

\* \* \* \* \*